US012805067B2

(12) United States Patent
Liu et al.

(10) Patent No.: US 12,805,067 B2
(45) Date of Patent: Nov. 17, 2026

(54) DISPLAY PANEL WITH FIRST PIXEL UNIT STAGGERED WITH STACKED SECOND PIXEL UNIT AND PREPARATION METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventors: Weilai Liu, Wuhan (CN); Liang Sun, Wuhan (CN); Ping Zhu, Wuhan (CN); Weilong Zhou, Wuhan (CN); Lei Shi, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 407 days.

(21) Appl. No.: 18/565,389

(22) PCT Filed: Jun. 30, 2023

(86) PCT No.: PCT/CN2023/104771
§ 371 (c)(1),
(2) Date: Nov. 29, 2023

(87) PCT Pub. No.: WO2024/250366
PCT Pub. Date: Dec. 12, 2024

(65) Prior Publication Data

US 2025/0098368 A1 Mar. 20, 2025

(30) Foreign Application Priority Data

Jun. 8, 2023 (CN) ........................ 202310681809.4

(51) Int. Cl.
*H10H 20/813* (2025.01)
*H10H 20/01* (2025.01)
(Continued)

(52) U.S. Cl.
CPC .......... *H10H 20/813* (2025.01); *H10H 20/01* (2025.01); *H10H 20/8312* (2025.01); *H10W 90/00* (2026.01); *H10H 20/032* (2025.01)

(58) Field of Classification Search
CPC .. H10H 20/813; H10H 20/01; H10H 20/8312; H10H 20/032; H10W 90/00
See application file for complete search history.

(56) References Cited

U.S. PATENT DOCUMENTS

| | | | | |
|---|---|---|---|---|
| 6,936,856 B2 * | 8/2005 | Guenther | .............. | H10K 59/95 257/89 |
| 10,121,770 B2 * | 11/2018 | Bechtel | ................ | H10W 90/00 |

(Continued)

FOREIGN PATENT DOCUMENTS

| | | |
|---|---|---|
| CN | 113629109 A | 11/2021 |
| CN | 114093905 A | 2/2022 |

(Continued)

OTHER PUBLICATIONS

International Search Report in International application No. PCT/CN2023/104771, mailed on Feb. 1, 2024.

(Continued)

*Primary Examiner* — Lex H Malsawma
(74) *Attorney, Agent, or Firm* — PV IP PC; Christopher S. Ruprecht; Wei Te Chung

(57) ABSTRACT

Disclosed are a display panel and a preparation method thereof. The display panel includes an array substrate and a plurality of pixel unit groups. Each of the pixel unit groups includes a first pixel unit and a second pixel unit. The first pixel unit includes a first light-emitting unit layer. The
(Continued)

second pixel unit includes a second light-emitting unit layer and a third light-emitting unit layer, and the second light-emitting unit layer and the third light-emitting unit layer are sequentially stacked in a direction facing away from the array substrate.

18 Claims, 6 Drawing Sheets

(51) Int. Cl.

| | |
|---|---|
| ***H10H 20/831*** | (2025.01) |
| ***H10W 90/00*** | (2026.01) |

(56) References Cited

U.S. PATENT DOCUMENTS

| | | | | |
|---|---|---|---|---|
| 11,522,006 | B2 * | 12/2022 | Lee | H10H 29/142 |
| 2002/0079834 | A1 * | 6/2002 | Dai | H10H 29/142<br>313/506 |
| 2012/0248473 | A1 * | 10/2012 | Kuo | H10H 20/857<br>257/E33.012 |
| 2015/0301342 | A1 * | 10/2015 | Johnson | G02B 30/27<br>29/846 |
| 2017/0025567 | A1 * | 1/2017 | Lu | H10H 29/14 |
| 2018/0269352 | A1 * | 9/2018 | Tian | H10H 20/01 |
| 2021/0184076 | A1 | 6/2021 | Kim et al. | |

FOREIGN PATENT DOCUMENTS

| | | | |
|---|---|---|---|
| CN | 114709234 | A | 7/2022 |
| CN | 114725151 | A | 7/2022 |
| CN | 115763454 | A | 3/2023 |
| CN | 115911076 | A | 4/2023 |
| CN | 116190404 | A | 5/2023 |
| WO | 2020211537 | A1 | 10/2020 |
| WO | 2020257680 | A1 | 12/2020 |

OTHER PUBLICATIONS

Written Opinion of the International Search Authority in International application No. PCT/CN2023/104771, mailed on Feb. 1, 2024.

Chinese Office Action issued in corresponding Chinese Patent Application No. 202310681809.4 dated Aug. 11, 2025, pp. 1-8.

* cited by examiner

DISPLAY PANEL WITH FIRST PIXEL UNIT STAGGERED WITH STACKED SECOND PIXEL UNIT AND PREPARATION METHOD THEREOF

CROSS-REFERENCE TO RELATED APPLICATIONS

This application a National Phase of PCT Patent Application No. PCT/CN2023/104771, filed on Jun. 30, 2023, which claims priority to Chinese Application No. 202310681809.4, filed on Jun. 8, 2023. The entire disclosures of each of the above applications are incorporated herein by reference.

FIELD OF INVENTION

The present disclosure relates to the field of display technologies, and in particular, to a display panel and a preparation method therefor.

BACKGROUND OF INVENTION

Micro light-emitting diode (Micro-LED) display has features of ultra-high density pixel resolution and self-emitting. In comparison with OLED display and LCD display, colors of Micro-LED display are easier to accurately debug, and Micro-LED display has a longer emitting life and higher brightness, while has more advantages of thinness and energy-saving, which has a wide market application prospects.

In related technologies, a manner to achieve full-color display of Micro-LED is to set up an additional quantum dot film layer in a display panel, and a blue LED chip is used to excite quantum dots in the quantum dot film layer, thereby generating color light. In this full-color manner, in order to ensure efficiency of color conversion and light extraction, a thickness of the quantum dot film layer needs to be set to be thick. However, a thick quantum dot film layer may restrict a size of a display pixel, making it difficult to improve resolution of the display panel, increasing manufacturing costs, and also prone to a problem of optical crosstalk between adjacent display pixels, which needs to be resolved urgently.

SUMMARY OF INVENTION

The present disclosure provides a display panel and a preparation method thereof, which can effectively alleviate problems of a conventional Micro-LED display panel, such as difficult improvement of resolution, high manufacturing costs, and optical crosstalk.

According to an aspect, the present disclosure provides a display panel. The display panel includes an array substrate and a plurality of pixel unit groups disposed on a side of the array substrate. Each of the pixel unit groups includes a first pixel unit and a second pixel unit, and an orthographic projection of the first pixel unit on the array substrate and an orthographic projection of the second pixel unit on the array substrate are staggered. The first pixel unit includes a first light-emitting unit layer for emitting a first light color; the second pixel unit includes a second light-emitting unit layer for emitting a second light color and a third light-emitting unit layer for emitting a third light color, and the second light-emitting unit layer and the third light-emitting unit layer are sequentially stacked in a direction facing away from the array substrate.

Optionally, the first light color is red, the second light color is one of blue or green, and the third light color is the other of blue or green.

Optionally, the first pixel unit includes a first semiconductor layer of a first doping type, the first light-emitting unit layer, and a second semiconductor layer of a second doping type sequentially stacked in the direction facing away from the array substrate; the second pixel unit includes a third semiconductor layer of the second doping type, the second light-emitting unit layer, a fourth semiconductor layer of the first doping type, the third light-emitting unit layer, and a fifth semiconductor layer of the second doping type sequentially stacked in the direction facing away from the array substrate. The first doping type is one of N-type or P-type, and the second doping type is the other of N-type or P-type.

Optionally, the first pixel unit further includes a first electrode in contact with the first semiconductor layer of the first doping type and a second electrode in contact with the second semiconductor layer of the second doping type. The second pixel unit further includes a third electrode in contact with the third semiconductor layer of the second doping type, a fourth electrode in contact with the fourth semiconductor layer of the first doping type, and a fifth electrode in contact with the fifth semiconductor layer of the second doping type. The first electrode and the fourth electrode are of a same electrode type, and are one of anodes or cathodes, and the first electrode is electrically connected to the fourth electrode. The second electrode, the third electrode, and the fifth electrode are of a same electrode type, and are the other of anodes or cathodes, and the second electrode, the third electrode, and the fifth electrode are insulated from each other.

Optionally, the fourth semiconductor layer of the first doping type includes a first part that is not covered by the third light-emitting unit layer, and the fourth electrode is in contact with the first part.

Optionally, the array substrate includes a plurality of pad groups, and each of the pad groups corresponds to one pixel unit group. Each of the pad groups includes a first pad, a second pad, a third pad, and a fourth pad. The first pad is electrically connected to the first electrode and the fourth electrode, the second pad is electrically connected to the second electrode, the third pad is electrically connected to the third electrode, and the fourth pad is electrically connected to the fifth electrode.

Optionally, the first electrode is disposed on a side of the first semiconductor layer of the first doping type facing the array substrate, and the first electrode is in contact with and electrically connected to the first pad. The third electrode is disposed on a side of the third semiconductor layer of the second doping type facing the array substrate, and the third electrode is in contact with and electrically connected to the third pad.

Optionally, a distance between a surface of the second semiconductor layer of the second doping type facing away from the array substrate and the array substrate is a first distance; and a distance between a surface of the fifth semiconductor layer of the second doping type facing away from the array substrate and the array substrate is a second distance. The second distance is greater than the first distance.

Optionally, the first electrode is disposed on a side of the first semiconductor layer of the first doping type facing the array substrate, and the first electrode is in contact with and electrically connected to the first pad; and the third electrode is disposed on a side of the third semiconductor layer of the second doping type facing the array substrate. The display panel further includes a plurality of insulating protrusions, each of the insulating protrusions is disposed between the third electrode and the array substrate, and the third electrode is electrically connected to the third pad through a via hole in each of the insulating protrusions.

Optionally, a distance between surfaces of the insulating protrusions facing away from the array substrate and the array substrate is a third distance; and a distance between a surface of the second semiconductor layer of the second doping type facing away from the array substrate and the array substrate is a fourth distance. The third distance is equal to the fourth distance.

According to another aspect, the present disclosure provides a method of preparing a display panel. The method of preparing the display panel includes steps of:

forming a first pixel composite layer on a side of a first base, wherein the first pixel composite layer includes a second semiconductor layer of a second doping type, a first light-emitting unit layer, and a first semiconductor layer of a first doping type sequentially stacked; forming a second pixel composite layer on a side of a second base, wherein the second pixel composite layer includes a fifth semiconductor layer of the second doping type, a third light-emitting unit layer, a fourth semiconductor layer of the first doping type, a second light-emitting unit layer, and a third semiconductor layer of the second doping type sequentially stacked;

bonding a side of the first pixel composite layer facing away from the first base to a side of an array substrate, and removing the first base; and bonding a side of the second pixel composite layer facing away from the second base to a side of the array substrate, and removing the second base.

The first pixel composite layer is patterned before the step of bonding a side of the first pixel composite layer facing away from the first base to a side of an array substrate, and removing the first base; and the second pixel composite layer is patterned before the step of bonding a side of the second pixel composite layer facing away from the second base to a side of the array substrate, and removing the second base.

Alternatively, the first pixel composite layer is patterned after the step of bonding a side of the first pixel composite layer facing away from the first base to a side of an array substrate, and removing the first base; and the second pixel composite layer is patterned after the step of bonding a side of the second pixel composite layer facing away from the second base to a side of the array substrate, and removing the second base, wherein after the first pixel composite layer is patterned, an insulating protrusion is formed in a patterned area of the first pixel composite layer, and a via hole running through the insulating protrusion is formed. A distance between a surface of the insulating protrusion facing away from the array substrate and the array substrate is a third distance, a distance between a surface of the first pixel composite layer facing away from the array substrate and the array substrate is a fourth distance, and the third distance is equal to the fourth distance. Then, the side of the second pixel composite layer facing away from the second base is bonded to the side of the array substrate, and the second base is removed.

Beneficial Effect

The present disclosure provides a display panel and a preparation method thereof. The display panel includes an array substrate and a plurality of pixel unit groups. Each of the pixel unit groups includes a first pixel unit and a second pixel unit, and an orthographic projection of the first pixel unit on the array substrate and an orthographic projection of the second pixel unit on the array substrate are staggered. The first pixel unit includes a first light-emitting unit layer for emitting a first light color. The second pixel unit includes a second light-emitting unit layer for emitting a second light color and a third light-emitting unit layer for emitting a third light color, and the second light-emitting unit layer and the third light-emitting unit layer are sequentially stacked in a direction facing away from the array substrate. In the display panel provided by the present disclosure, because each pixel unit group includes a first pixel unit and a second pixel unit, and the second pixel unit includes two light-emitting unit layers for emitting different light colors stacked, so that resolution can be improved, costs can be reduced, and display quality can be improved while achieving full-color display. In addition, light-emitting efficiency of a red light-emitting unit layer can be effectively improved, thereby effectively improving overall light-emitting efficiency of the display panel.

BRIEF DESCRIPTION OF DRAWINGS

To describe the technical solutions in the embodiments of the present disclosure clearly, the following is a brief introduction to drawings needed to be used in description of the embodiments. Apparently, the drawings described below are merely some embodiments of the present disclosure. For a person skilled in the art, other drawings can be obtained based on these drawings without creative efforts.

Figure 1:
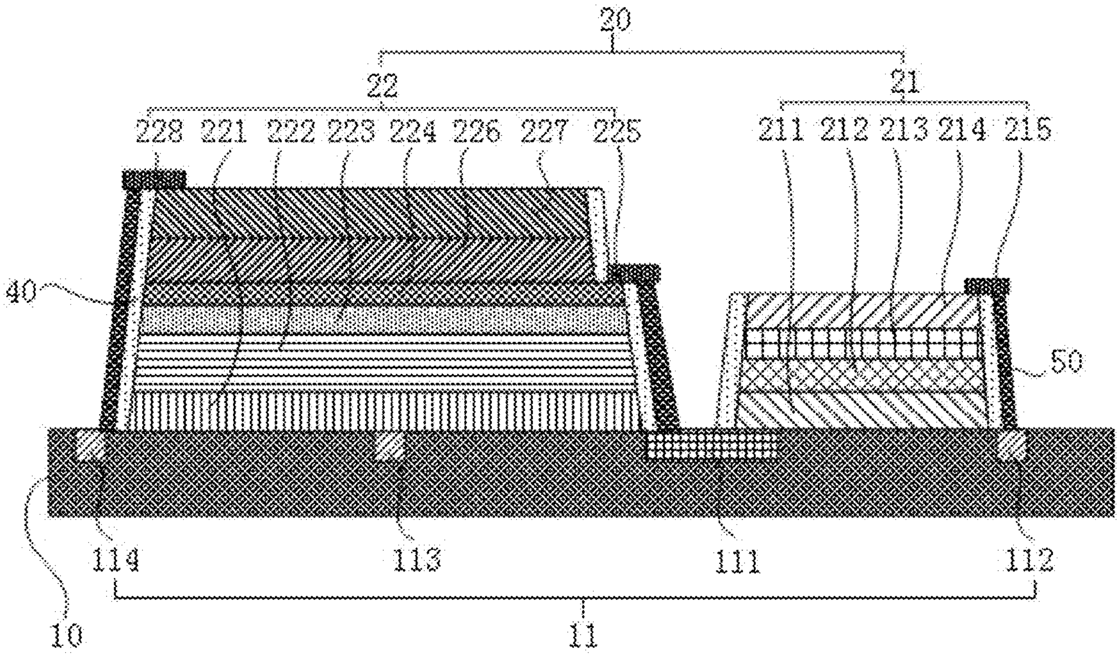
FIG. 1 is a schematic diagram of a film layer structure of a pixel unit group disposed on a side of an array substrate according to Embodiment 1 of the present disclosure.

LIST OF REFERENCE NUMBERS array substrate 10; pad group 11; first pad 111; second pad 112; third pad 113; fourth pad 114; pixel unit group 20; first pixel unit 21; first electrode 211; first semiconductor layer 212; first light-emitting unit layer 213; second semiconductor layer 214; second electrode 215; second pixel unit 22; third electrode 221; third semiconductor layer 222; second light-emitting unit layer 223; fourth semiconductor layer 224; first part 2241; fourth electrode 225; third light-emitting unit layer 226; fifth semiconductor layer 227; fifth electrode 228; insulating protrusion 30; via hole 31; insulating layer 40; connection line 50; first base 101; first pixel composite layer 102; second base 103; second pixel composite layer 104; first composite metal layer 105; second composite metal layer 106.

DETAILED DESCRIPTION OF PREFERRED EMBODIMENTS

The technical solutions of the embodiments of the present disclosure are clearly and fully described below with reference to the accompanying drawings of the embodiments of the present disclosure. Apparently, the described embodiments are merely some but not all of the embodiments of the present disclosure. All other embodiments obtained by a person skilled in the art based on the embodiments of the present disclosure without creative efforts shall fall within the scope of the present disclosure. In addition, it is to be understood that the specific implementations described herein are intended merely to describe and explain the present disclosure and are not intended to limit the present disclosure. In the present disclosure, in a case that no statement to the contrary is made, directional terms, such as "up" and "down" used generally refer to up and down of a device in actual use or a working condition, specifically a drawing direction in the accompanying drawings, while "inside" and "outside" refer to an outline of the device.

The disclosures below provide a plurality of different implementations or examples to implement different structures of the present disclosure. To simplify the disclosures of the present disclosure, components and settings for specific examples are described below. Certainly, the specific embodiments are merely examples and are not intended to limit the present disclosure. In addition, the present disclosure may repeat reference numbers and/or reference letters in different examples for a purpose of simplification and clarity and does not indicate relationships between the various implementations and/or settings discussed. In addition, the present disclosure provides examples of various specific processes and materials, but a person of ordinary skill in the art may be aware of application of other processes and/or use of other materials. The following are described in detail. It is to be noted that an order of description of the following embodiments is not used as a limitation on a preferred order of the embodiments.

In related technologies, an architecture design of a Micro-LED display panel to achieve full color is: each pixel unit group includes a red pixel unit, a green pixel unit, and a blue pixel unit. The red pixel unit includes a blue LED chip and a red quantum dot film layer on the blue LED chip, the green pixel unit includes a blue LED chip and a green quantum dot film layer on the blue LED chip, and the blue pixel unit includes a blue LED chip. In such display architecture, because the light-emitting unit (i.e., the LED chip) in each pixel unit emits blue light, an additional quantum dot film layer is needed, so that the quantum dots in the quantum dot film layer can be excited by monochromatic light to achieve full-color display. However, the quantum dot film layer may restrict a size of a display pixel, making it difficult to improve resolution of the display panel, increasing manufacturing costs, and prone to a problem of optical crosstalk between adjacent display pixels.

Embodiment 1

According to a first aspect, Embodiment 1 of the present disclosure provides a display panel, which can achieve full color without setting up a quantum dot film layer, thereby improving resolution of the display panel, reducing manufacturing costs, and improving display quality.

FIG. 1 is a schematic diagram of a film layer structure of a pixel unit group disposed on a side of an array substrate according to Embodiment 1 of the present disclosure. As shown in FIG. 1, Embodiment 1 of the present disclosure provides a display panel. The display panel includes an array substrate 10 and a plurality of pixel unit groups 20. The pixel unit groups 20 arc disposed on a side of the array substrate 10. Each pixel unit group 20 includes a first pixel unit 21 and a second pixel unit 22, and an orthographic projection of the first pixel unit 21 on the array substrate 10 and an orthographic projection of the second pixel unit 22 on the array substrate 10 are staggered. The first pixel unit 21 includes a first light-emitting unit layer 213 for emitting a first light color. The second pixel unit 22 includes a second light-emitting unit layer 223 for emitting a second light color and a third light-emitting unit layer 226 for emitting a third light color, and the second light-emitting unit layer 223 and the third light-emitting unit layer 226 are sequentially stacked in a direction facing away from the array substrate 10.

In the pixel unit group 20 provided in the present disclosure, the first pixel unit 21 may display the first light color through the first light-emitting unit layer 213. The second pixel unit 22 may display the second light color through the second light-emitting unit layer 223, and/or display the third light color through the third light-emitting unit layer 226. Therefore, the display panel can achieve full color display directly through the first pixel unit 21 and the second pixel unit 22 in the pixel unit group 20, without a quantum dot film layer. This can effectively reduce manufacturing costs, and can resolve a problem of restriction on a size of a pixel unit and optical crosstalk caused by setting up the quantum dot film layer. Therefore, a size of the first pixel unit 21 and a size of the second pixel unit 22 may be made smaller, thereby improving resolution and display quality.

In addition, in the present disclosure, the second pixel unit 22 is capable of emitting the second light color and/or the third light color by sequentially stacking the second light-emitting unit layer 223 and the third light-emitting unit layer 226 in the direction facing away from the array substrate 10, so that one pixel unit in the present disclosure can achieve a display function that is obtained by two pixel units in the related technologies, thereby reducing the number of pixel units. In comparison with a structure in which light-emitting unit layers of different colors are stacked in a horizontal direction in related technologies, in the present disclosure, space in the horizontal direction can be saved, and a layout area of the pixel unit group 20 is reduced, further improving resolution of the display panel, and reducing the number of transfers of pixel units in a process, thereby simplifying a production and preparation process, and reducing production and manufacturing costs.

In some embodiments of the present disclosure, the emitted first light color is red, the emitted second light color is one of blue or green, and the emitted third light color is the other of blue or green.

The inventors of the present disclosure have found that, a material of a light-emitting unit layers for emitting blue light and a material of a light-emitting unit layers for emitting green light are usually an InGaN/GaN quantum well material. Coaxial growth of the light-emitting unit layer for emitting blue light and the light-emitting unit layer for emitting green light can ensure better epitaxy quality, to obtain higher light-emitting efficiency. In addition, a material of a light-emitting unit layer for emitting red light is usually an AlGaInP/GaInP quantum well material. A difference in the materials makes it difficult for the light-emitting unit layer for emitting red light to grow coaxially with the light-emitting unit layer for emitting blue light and the light-emitting unit layer for emitting green light. In the present disclosure, the first light color is selected as red, the second light color is selected as one of blue or green, and the third light color is selected as the other of blue or green. This can ensure a light-emitting effect and improve a preparation yield rate.

In addition, in comparison with a structure in which a red light-emitting layer, green light-emitting layer, and blue light-emitting layer are stacked in a vertical direction in the related technologies, in the present disclosure, the first pixel unit 21 has only the light-emitting unit layer for emitting red light without other light-emitting unit layers in a direction perpendicular to the array substrate 10. Therefore, light-emitting efficiency of the light-emitting unit layer for emitting red light can be ensured. At present, light-emitting efficiency of the red light-emitting unit layer is a main factor restricting overall light-emitting efficiency of the Micro-LED display panel. Therefore, improvement of the light-emitting efficiency of the red light-emitting unit layer can effectively improve overall light-emitting efficiency of the display panel.

In view of the above, in comparison with the conventional technology, the present disclosure can effectively balance resolution of the display panel and overall light-emitting efficiency.

In some embodiments of the present disclosure, the first pixel unit 21 includes a first semiconductor layer 212 of a first doping type, the first light-emitting unit layer 213, and a second semiconductor layer 214 of a second doping type sequentially stacked in the direction facing away from the array substrate 10. The second pixel unit 22 includes a third semiconductor layer 222 of the second doping type, the second light-emitting unit layer 223, a fourth semiconductor layer 224 of the first doping type, the third light-emitting unit layer 226, and a fifth semiconductor layer 227 of the second doping type sequentially stacked in the direction facing away from the array substrate 10. The first doping type is one of N-type or P-type, and the second doping type is the other of N-type or P-type.

In the first pixel unit 21 provided in the present disclosure, because doping types of the first semiconductor layer 212 and the second semiconductor layer 214 located on both sides of the first light-emitting unit layer 213 are different, a PN junction can be formed, and a light-emitting state of the first light-emitting unit layer 213 can be controlled through on and off of the PN junction. In the second pixel unit 22 provided in the present disclosure, because doping types of the third semiconductor layer 222 and the fourth semiconductor layer 224 located on both sides of the second light-emitting unit layer 223 are different, a PN junction can be formed, and a light-emitting state of the second light-emitting unit layer 223 can be controlled through on and off of the PN junction. In addition, because doping types of the fifth semiconductor layer 227 and the fourth semiconductor layer 224 located on both sides of the third light-emitting unit layer 226 are different, a PN junction can be formed, and a light-emitting state of the third light-emitting unit layer 226 can be controlled through on and off of the PN junction. Further, full-color display can be achieved by independently controlling the light-emitting states of the first light-emitting unit layer 213, the second light-emitting unit layer 223, and the third light-emitting unit layer 226 through a drive circuit in the display panel.

In some embodiments of the present disclosure, the first doping type is P-type, and the second doping type is N-type. A periodic stress regulating layer and a current diffusion layer may be also disposed between the second semiconductor layer 214 of the second doping type and the first light-emitting unit layer 213. A periodic stress regulating layer and a current diffusion layer may be also disposed between the third semiconductor layer 222 of the second doping type and the second light-emitting unit layer 223. A periodic stress regulating layer and a current diffusion layer may be also disposed between the fifth semiconductor layer 227 of the second doping type and the third light-emitting unit layer 226. A periodic stress regulating layer, a current diffusion layer, and a first Bragg reflecting layer may be disposed between the first semiconductor layer 212 of the first doping type and the first light-emitting unit layer 213, and the first Bragg reflecting layer can transmit red light. A periodic stress regulating layer, a current diffusion layer, and a second Bragg reflecting layer may be disposed between the fourth semiconductor layer 224 of the first doping type and the third light-emitting unit layer 226, and the second Bragg reflecting layer can transmit blue light and green light. Optionally, the first Bragg reflecting layer and the second Bragg reflecting layer include at least one composite film layer, and the composite film layer is a laminated structure formed by SiO2 and Ti3O5.

In some embodiments of the present disclosure, the first pixel unit 21 further includes a first electrode 211 and a second electrode 215. The first electrode 211 is in contact with the first semiconductor layer 212 of the first doping type, and the second electrode 215 is in contact with the second semiconductor layer 214 of the second doping type. The second pixel unit 22 further includes a third electrode 221, a fourth electrode 225, and a fifth electrode 228. The third electrode 221 is in contact with the third semiconductor layer 222 of the second doping type, the fourth electrode 225 is in contact with the fourth semiconductor layer 224 of the first doping type, and the fifth electrode 228 is in contact with the fifth semiconductor layer 227 of the second doping type.

The first electrode 211 and the fourth electrode 225 are of a same electrode type, and are both one of an anode or a cathode, and the first electrode 211 is electrically connected to the fourth electrode 225. In other words, both the first electrode 211 and the fourth electrode 225 are anodes, or both the first electrode 211 and the fourth electrode 225 are cathodes. Because the first electrode 211 and the fourth electrode 225 are of the same electrode type, the first electrode 211 and the fourth electrode 225 can be electrically connected to a same pad on the array substrate 10, thereby reducing the number of pads, simplifying a structure of the display panel, and reducing difficulty of binding.

The second electrode 215, the third electrode 221, and the fifth electrode 228 are of a same electrode type, and are all the other of an anode or a cathode, and the second electrode 215, the third electrode 221, and the fifth electrode 228 are insulated from each other. In other words, the second electrode 215, the third electrode 221, and the fifth electrode 228 are all cathodes, or the second electrode 215, the third electrode 221, and the fifth electrode 228 are all anodes. Because the second electrode 215, the third electrode 221, and the fifth electrode 228 are insulated from each other, the first light-emitting unit layer 213, the second light-emitting unit layer 223, and the third light-emitting unit layer 226 can be independently controlled by the second electrode 215, the third electrode 221, and the fifth electrode 228, respectively. Therefore, independent light-emitting of the first light-emitting unit layer 213, the second light-emitting unit layer 223, and the third light-emitting unit layer 226 can be achieved.

In some embodiments of the present disclosure, the fourth semiconductor layer 224 of the first doping type includes a first part 2241 not covered by the third light-emitting unit layer 226, and the fourth electrode 225 is in contact with the first part 2241.

In the display panel provided in the present disclosure, because the first part 2241 in the fourth semiconductor layer 224 of the first doping type is not covered by the third light-emitting unit layer 226, the fourth electrode 225 may be disposed on a side of the first part 2241 facing away from the second light-emitting unit layer 223, to reduce difficulty of setting the fourth electrode 225.

In some embodiments of the present disclosure, the array substrate 10 includes a plurality of pad groups 11, and each pad group 11 corresponds to one pixel unit group 20. The pad group 11 includes a first pad 111, a second pad 112, a third pad 113, and a fourth pad 114. The first pad 111 is electrically connected to the first electrode 211 and the fourth electrode 225. The second pad 112 is electrically connected to the second electrode 215. The third pad 113 is electrically connected to the third electrode 221, and the fourth pad 114 is electrically connected to the fifth electrode 228.

In the display panel provided in the present disclosure, because the first pad 111 is electrically connected to the first electrode 211 and the fourth electrode 225, the first electrode 211 and the fourth electrode 225 can be controlled by one pad, thereby reducing the number of to-be-set pads. Because the second pad 112 is electrically connected to the second electrode 215, the third pad 113 is electrically connected to the third electrode 221, and the fourth pad 114 is electrically connected to the fifth electrode 228, the second electrode 215, the third electrode 221, and the fifth electrode 228 can be controlled by the second pad 112, the third pad 113, and the fourth pad 114, respectively. Therefore, independent light-emitting of the first light-emitting unit layer 213, the second light-emitting unit layer 223, and the third light-emitting unit layer 226 can be achieved.

Optionally, the array substrate 10 is an integrated circuit wafer. The integrated circuit wafer includes a drive circuit layer and a plurality of pad groups 11 disposed on the drive circuit layer.

In some embodiments of the present disclosure, the first electrode 211 is disposed on a side of the first semiconductor layer 212 of the first doping type facing the array substrate 10, and the first electrode 211 is in contact with and electrically connected to the first pad 111. The third electrode 221 is disposed on a side of the third semiconductor layer 222 of the second doping type facing the array substrate 10, and the third electrode 221 is in contact with and electrically connected to the third pad 113.

In the display panel provided in the present disclosure, the first pixel unit 21 and the second pixel unit 22 are disposed on a side of the array substrate 10, for example, using metal bonding. Because the first electrode 211 is in contact with and electrically connected to the first pad 111, and the third electrode 221 is in contact with and electrically connected to the third pad 113, a connection structure of electrodes is simplified, to enable the display panel to be thinner, and the first pixel unit 21 and the second pixel unit 22 can be formed using chip bonding in a process, thereby simplifying a production and preparation process.

In some embodiments of the present disclosure, a distance between a surface of the second semiconductor layer 214 of the second doping type facing away from the array substrate 10 and the array substrate 10 is a first distance. A distance between a surface of the fifth semiconductor layer 227 of the second doping type facing away from the array substrate 10 and the array substrate 10 is a second distance. The second distance is greater than the first distance.

In the display panel of the present disclosure, because the distance between a surface of the second semiconductor layer 214 of the second doping type facing away from the array substrate 10 and the array substrate 10 is less than the distance between a surface of the fifth semiconductor layer 227 of the second doping type facing away from the array substrate 10 and the array substrate 10, overall thickness of the second pixel unit 22 is greater than the overall thickness of the first pixel unit 21. Therefore, after the first pixel unit 21 is formed on a side of the array substrate 10 through a metal bonding process, during a process of forming the second pixel unit 22 on a side of the array substrate 10 through a metal bonding process, it is ensured that a bonding metal layer disposed on a side of the third semiconductor layer 222 away from the second light-emitting unit layer 223 can be fully in contact with a bonding metal layer on a side of the array substrate 10 to complete metal bonding and form the third electrode 221.

In some embodiments of the present disclosure, the display panel further includes a plurality of connection lines 50. The second electrode 215 is electrically connected to the second pad 112 through the connection line 50. The fourth electrode 225 is electrically connected to the third pad 113 through the connection line 50. The fifth electrode 228 is electrically connected to the fourth pad 114 through the connection line 50.

In some embodiments of the present disclosure, the display panel further includes an insulating layer 40. The insulating layer 40 is disposed between the connection line 50 and the first pixel unit 21 and between the connection line 50 and the second pixel unit 22.

According to a second aspect, Embodiment 1 of the present disclosure further provides a method of preparing a display panel. The method includes steps of:

forming a first pixel composite layer on a side of a first base, wherein the first pixel composite layer includes a second semiconductor layer of a second doping type, a first light-emitting unit layer, and a first semiconductor layer of a first doping type sequentially stacked; forming a second pixel composite layer on a side of a second base, wherein the second pixel composite layer includes a fifth semiconductor layer of the second doping type, a third light-emitting unit layer, a fourth semiconductor layer of the first doping type, a second light-emitting unit layer, and a third semiconductor layer of the second doping type sequentially stacked;

bonding a side of the first pixel composite layer facing away from the first base to a side of an array substrate, and removing the first base; and bonding a side of the second pixel composite layer facing away from the second base to a side of the array substrate, and removing the second base.

The first pixel composite layer is patterned before the step of bonding a side of the first pixel composite layer facing away from the first base to a side of an array substrate, and removing the first base. The second pixel composite layer is patterned before the step of bonding a side of the second pixel composite layer facing away from the second base to a side of the array substrate, and removing the second base.

Figure 2:
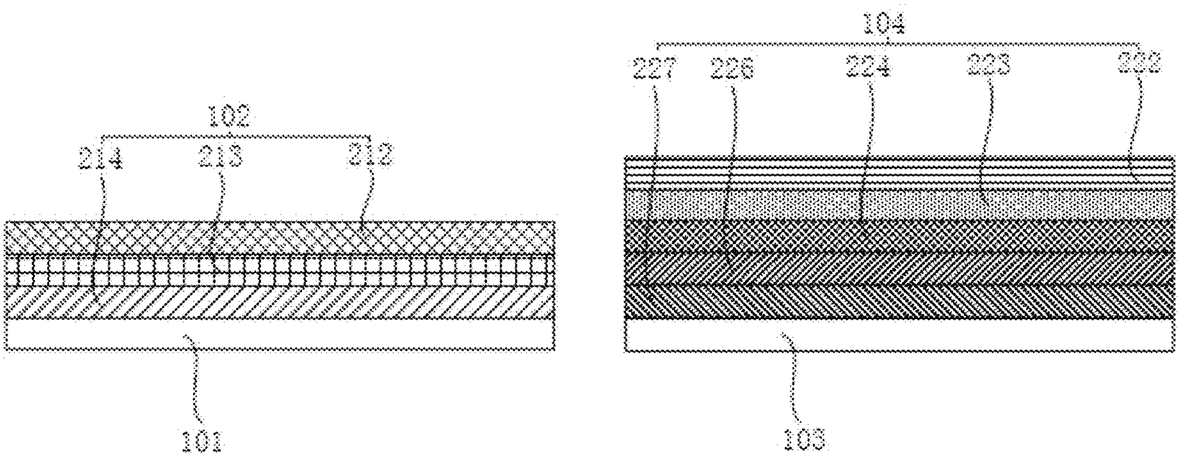
FIG. 2 is a schematic diagram of a structure corresponding to step S01 in a method of preparing a display panel according to Embodiment 1 of the present disclosure.
Figure 3:
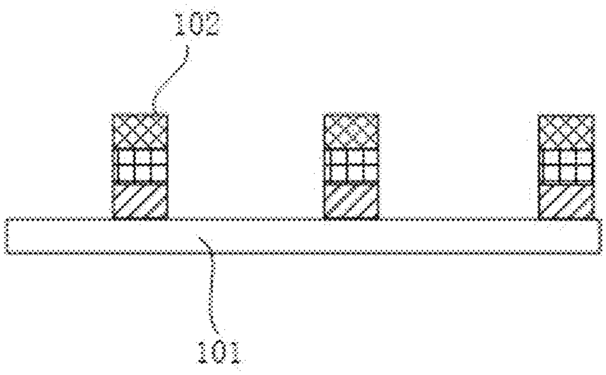
FIG. 3 is a schematic diagram of a structure corresponding to step S02 in a method of preparing a display panel according to Embodiment 1 of the present disclosure.
Figure 4:
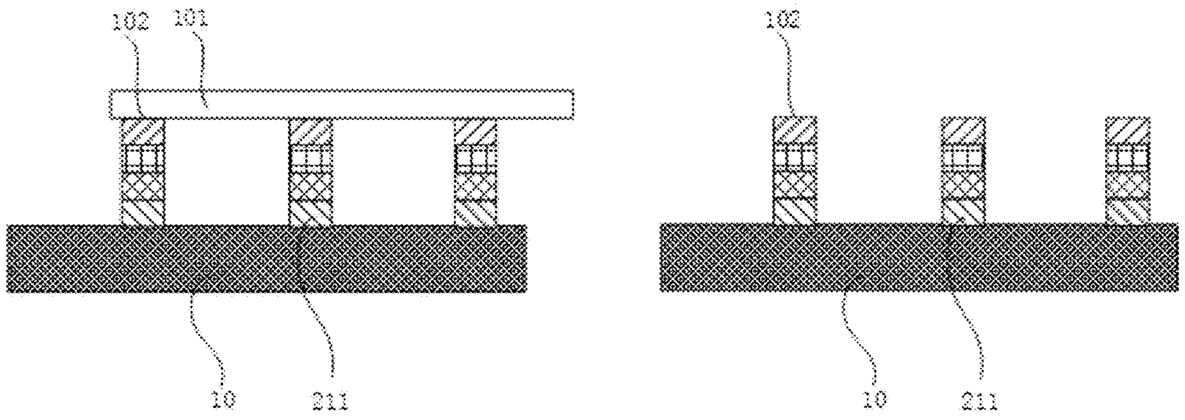
FIG. 4 is a schematic diagram of a structure corresponding to step S03 in a method of preparing a display panel according to Embodiment 1 of the present disclosure.
Figure 5:
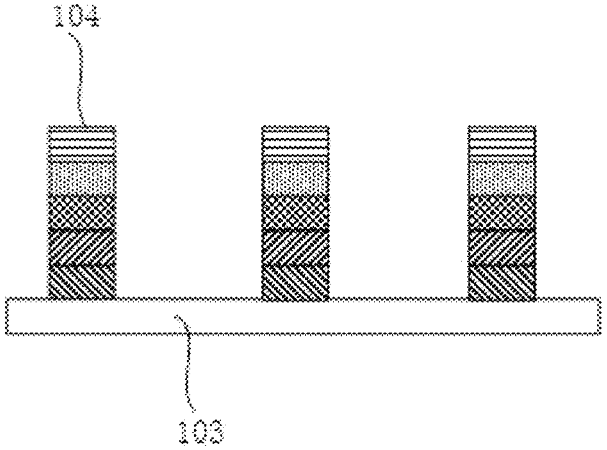
FIG. 5 is a schematic diagram of a structure corresponding to step S04 in a method of preparing a display panel according to Embodiment 1 of the present disclosure.
Figure 6:
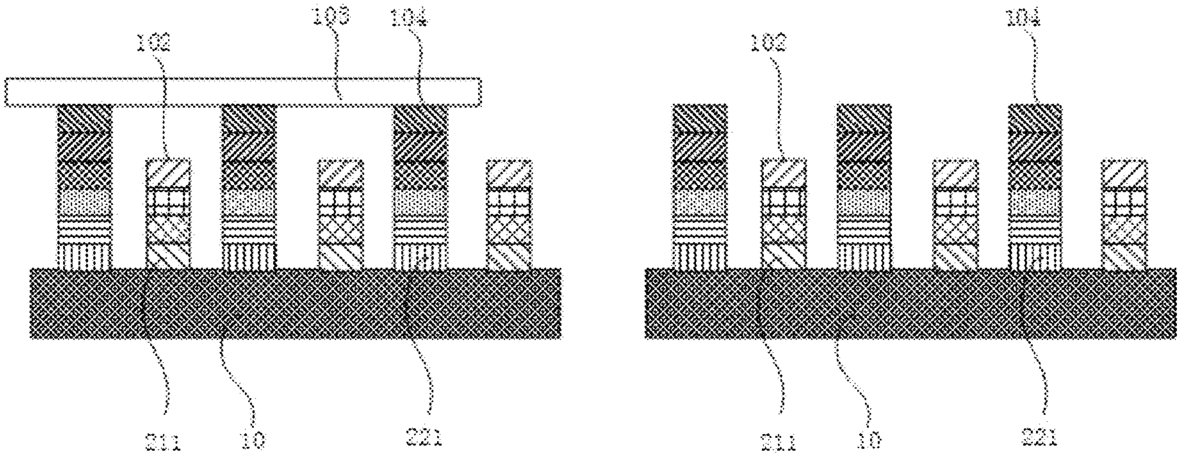
FIG. 6 is a schematic diagram of a structure corresponding to step S05 in a method of preparing a display panel according to Embodiment 1 of the present disclosure.
Figure 7:
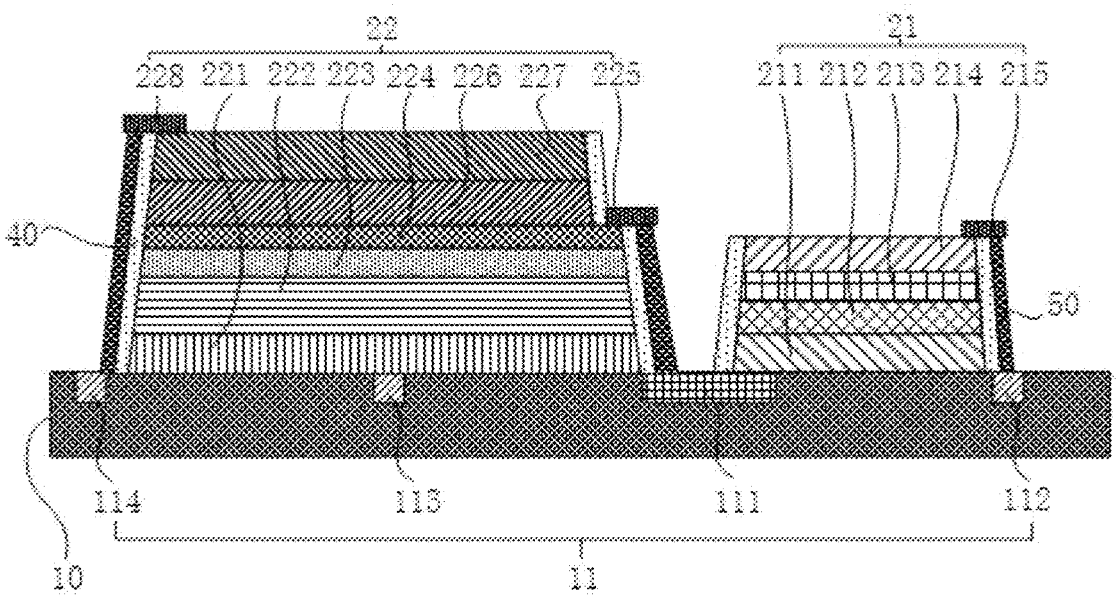
FIG. 7 is a schematic diagram of a structure corresponding to step S06 in a method of preparing a display panel according to Embodiment 1 of the present disclosure.

Specifically, FIG. 2 is a schematic diagram of a structure corresponding to step S01 in a method of preparing a display panel according to Embodiment 1 of the present disclosure. FIG. 3 is a schematic diagram of a structure corresponding to step S02 in a method of preparing a display panel according to Embodiment 1 of the present disclosure. FIG. 4 is a schematic diagram of a structure corresponding to step S03 in a method of preparing a display panel according to Embodiment 1 of the present disclosure. FIG. 5 is a schematic diagram of a structure corresponding to step S04 in a method of preparing a display panel according to Embodiment 1 of the present disclosure. FIG. 6 is a schematic diagram of a structure corresponding to step S05 in a method of preparing a display panel according to Embodiment 1 of the present disclosure. FIG. 7 is a schematic diagram of a structure corresponding to step S06 in a method of preparing a display panel according to Embodiment 1 of the present disclosure. With reference to FIGS. 1 to 7, the method of preparing a display panel includes steps of:

S01: Forming a first pixel composite layer 102 on a side of a first base 101, wherein the first pixel composite layer 102 includes a second semiconductor layer 214 of a second doping type, a first light-emitting unit layer 213, and a first semiconductor layer 212 of a first doping type sequentially stacked; forming a second pixel composite layer 104 on a side of a second base 103, wherein the second pixel composite layer 104 includes a fifth semiconductor layer 227 of the second doping type, a third light-emitting unit layer 226, a fourth semiconductor layer 224 of the first doping type, a second light-emitting unit layer 223, and a third semiconductor layer 222 of the second doping type sequentially stacked. The first base 101 is a GaAs base. The second doping type is N-type, and the second semiconductor layer 214 includes a GaAs material. The first doping type is P-type, and the first semiconductor layer includes a GaP material. The second base 103 is a sapphire base, or includes at least one of GaN, AlN, Si, or SiC. The fifth semiconductor layer 227 and the third semiconductor layer 222 include at least one of a GaN material, an AlGaN material, or an AlInGaN material. The fourth semiconductor layer 224 includes a GaN material.

S02: Patterning the first pixel composite layer 102.

S03: Bonding a side of the first pixel composite layer 102 facing away from the first base 101 to a side of an array substrate 10, and removing the first base 101. Step S03 specifically includes: forming a first metal bonding layer on the side of the first pixel composite layer 102 facing away from the first base 101, wherein a material of the first metal bonding layer may be any of Au, Sn, In, Ti, or Cu; forming a second metal bonding layer on the side of the array substrate 10, wherein a material of the second metal bonding layer may be any of Au, Sn, In, Ti, or Cu; bonding the side of the first pixel composite layer 102 facing away from the first base 101 to the side of the array substrate 10 by bonding the first metal bonding layer with the second metal bonding layer, wherein the first electrode 211 of the first pixel unit 21 is formed after the first metal bonding layer and the second metal bonding layer are bonded, and the array substrate 10 includes a plurality of pad groups 11, wherein each pad group 11 includes a first pad 111, a second pad 112, a third pad 113, and a fourth pad 114, the first electrode 211 is in contact with and electrically connected to the first pad 111, a thickness of the first electrode 211 is 0.1 microns to 3 microns, and the first electrode 211 further has a reflective function; removing the first base 101.

S04: Patterning the second pixel composite layer 104.

S05: Bonding a side of the second pixel composite layer 104 facing away from the second base 103 to a side of the array substrate 10, and removing the second base 103. Step S05 specifically includes: forming a third metal bonding layer on the side of the second pixel composite layer 104 facing away from the second base 103, wherein a material of the third metal bonding layer may be any of Au, Sn, In, Ti, or Cu; forming a fourth metal bonding layer on the side of the array substrate 10, wherein a material of the fourth metal bonding layer may be any of Au, Sn, In, Ti, or Cu; bonding the side of the second pixel composite layer 104 facing away from the second base 103 to the side of the array substrate 10 by bonding the third metal bonding layer with the fourth metal bonding layer, wherein the third electrode 221 of the second pixel unit 22 is formed after the third metal bonding layer and the fourth metal bonding layer are bonded, wherein the third electrode 221 is in contact with and electrically connected to the third pad 113, a thickness of the third electrode 221 is 0.1 microns to 3 microns, and the third electrode 221 further has a reflective function; removing the second base 103.

S06: Forming a second electrode 215 on a side of the second semiconductor layer 214 of the second doping type facing away from the array substrate 10; forming a fourth electrode 225 on a side of the fourth semiconductor layer 224 of the first doping type facing away from the array substrate 10; and forming a fifth electrode 228 on a side of the fifth semiconductor layer 227 of the second doping type facing away from the array substrate 10. The second electrode 215 is electrically connected to the second pad 112 through a connection line 50. An insulating layer 40 is formed between the connection line 50 and the first pixel unit 21. The fourth electrode 225 is electrically connected to the third pad 113 through the connection line 50. The fifth electrode 228 is electrically connected to the fourth pad 114 through the connection line 50. The insulating layer 40 is formed between the connection line 50 and the second pixel unit 22.

In the method of preparing a display panel provided in the present disclosure, because the first pixel composite layer 102 is patterned before the step of bonding a side of the first pixel composite layer 102 facing away from the first base 101 to a side of an array substrate 10, and removing the first base 101; and the second pixel composite layer 104 is patterned before the step of bonding a side of the second pixel composite layer 104 facing away from the second base 103 to a side of the array substrate 10, and removing the second base 103, a production and preparation process of the display panel therefore can be simplified and the process steps can be reduced.

Embodiment 2

Figure 8:
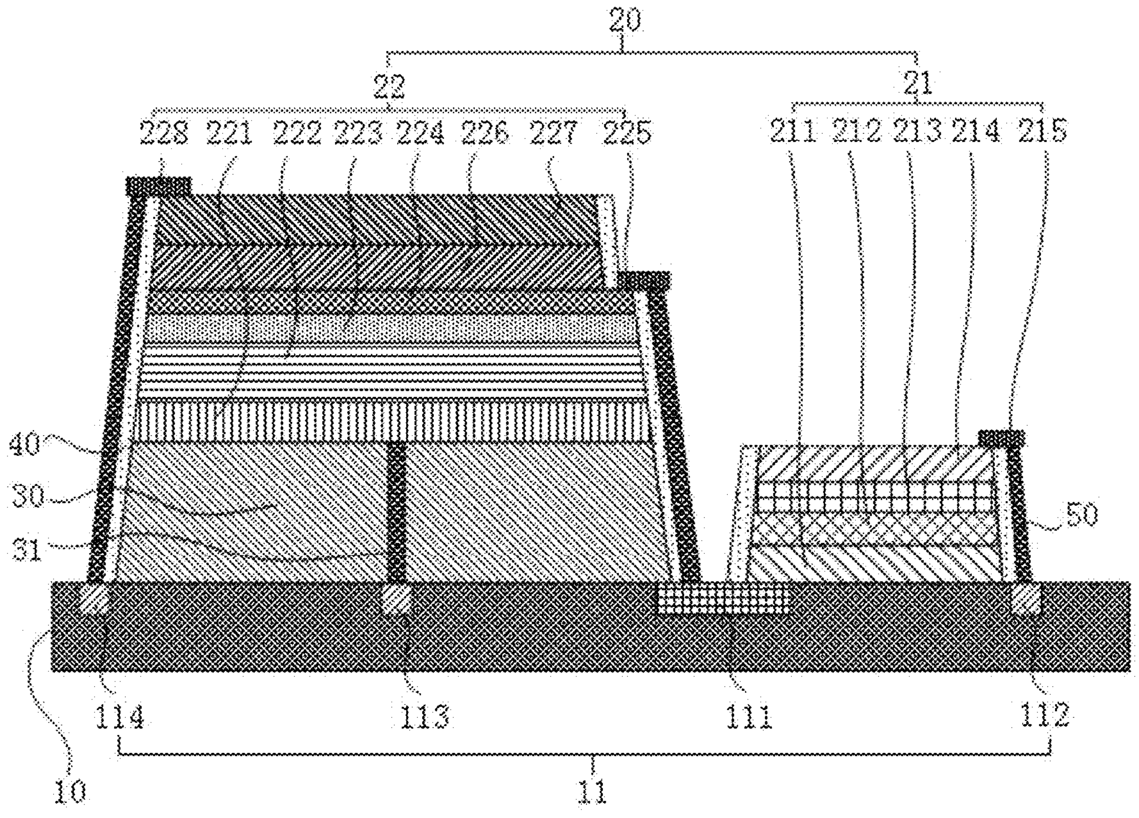
FIG. 8 is a schematic diagram of a film layer structure of a pixel unit group disposed on a side of an array substrate according to Embodiment 2 of the present disclosure.

FIG. 8 is a schematic diagram of a film layer structure of a pixel unit group 20 disposed on a side of an array substrate 10 according to Embodiment 2 of the present disclosure. As shown in FIG. 8, Embodiment 2 of the present disclosure provides a display panel. The display panel includes an array substrate 10 and a plurality of pixel unit groups 20. The pixel unit groups 20 arc disposed on a side of the array substrate 10. Each pixel unit group 20 includes a first pixel unit 21 and a second pixel unit 22, and an orthographic projection of the first pixel unit 21 on the array substrate 10 and an orthographic projection of the second pixel unit 22 on the array substrate 10 are staggered. The first pixel unit 21 includes a first light-emitting unit layer 213 for emitting a first light color. The second pixel unit 22 includes a second light-emitting unit layer 223 for emitting a second light color and a third light-emitting unit layer 226 for emitting a third light color. The second light-emitting unit layer 223 and the third light-emitting unit layer 226 are sequentially stacked in a direction facing away from the array substrate 10.

It is to be noted that a structure of the display panel provided in Embodiment 2 of the present disclosure is similar to a structure of the display panel provided in Embodiment 1 of the present disclosure. A same part is not repeated in Embodiment 2 of the present disclosure.

Differences are: the first electrode 211 is disposed on a side of the first semiconductor layer 212 of the first doping type facing the array substrate 10, and the first electrode 211 is in contact with and electrically connected to the first pad 111; and the third electrode 221 is disposed on a side of the third semiconductor layer 222 of the second doping type facing the array substrate 10. The display panel further includes a plurality of insulating protrusions 30, each insulating protrusion 30 is disposed between the third electrode 221 and the array substrate 10, and the third electrode 221 is electrically connected to the third pad 113 through a via hole 31 in the insulating protrusion 30.

In the display panel provided in the embodiments of the present disclosure, because the display panel further includes the plurality of insulating protrusions 30, each insulating protrusion 30 is disposed between the third electrode 221 and the array substrate 10, and the third electrode 221 is electrically connected to the third pad 113 through the via hole 31 in the insulating protrusion 30, a requirement for alignment accuracy may be reduced when the first pixel unit 21 and the array substrate 10 are bonded, a requirement for alignment accuracy may be reduced when the second pixel unit 22 and the array substrate 10 are bonded. This is conducive to reducing production costs of the display panel.

In some embodiments of the present disclosure, a distance between a surface of the insulating protrusion 30 facing away from the array substrate 10 and the array substrate 10 is a third distance. A distance between a surface of the second semiconductor layer 214 of the second doping type facing away from the array substrate 10 and the array substrate 10 is a fourth distance. The third distance is equal to the fourth distance.

In the display panel of the present disclosure, because the third distance is equal to the fourth distance, the surface of the insulating protrusion 30 facing away from the array substrate 10 is in a same horizontal plane with the surface of the second semiconductor layer 214 of the second doping type facing away from the array substrate 10, thereby providing a flattening condition for subsequent formation of the second pixel unit 22, so that formation quality of the second pixel unit 22 is ensured, and display effect of the display panel can be improved.

According to a second aspect, Embodiment 2 of the present disclosure further provides a method of preparing a display panel. The method of preparing a display panel includes steps of:

- forming a first pixel composite layer on a side of a first base, wherein the first pixel composite layer includes a second semiconductor layer of a second doping type, a first light-emitting unit layer, and a first semiconductor layer of a first doping type sequentially stacked; forming a second pixel composite layer on a side of a second base, wherein the second pixel composite layer includes a fifth semiconductor layer of the second doping type, a third light-emitting unit layer, a fourth semiconductor layer of the first doping type, a second light-emitting unit layer, and a third semiconductor layer of the second doping type sequentially stacked;
- bonding a side of the first pixel composite layer facing away from the first base to a side of an array substrate, and removing the first base; and
- bonding a side of the second pixel composite layer facing away from the second base to a side of the array substrate, and removing the second base.

The first pixel composite layer is patterned after the step of bonding a side of the first pixel composite layer facing away from the first base to a side of an array substrate, and removing the first base; and the second pixel composite layer is patterned after the step of bonding a side of the second pixel composite layer facing away from the second base to a side of the array substrate, and removing the second base, wherein after the first pixel composite layer is patterned, an insulating protrusion is formed in a patterned area of the first pixel composite layer, and a via hole running through the insulating protrusion is formed, wherein a distance between a surface of the insulating protrusion facing away from the array substrate and the array substrate is a third distance, a distance between a surface of the first pixel composite layer facing away from the array substrate and the array substrate is a fourth distance, and the third distance is equal to the fourth distance; and then, the side of the second pixel composite layer facing away from the second base is bonded to the side of the array substrate, and the second base is removed.

Figure 9:
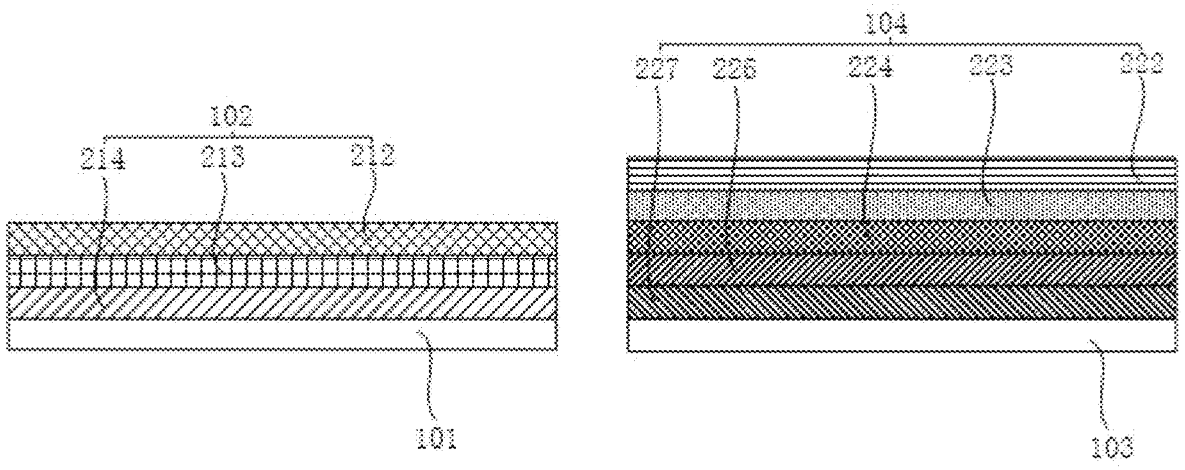
FIG. 9 is a schematic diagram of a structure corresponding to step S11 in a method of preparing a display panel according to Embodiment 2 of the present disclosure.
Figure 10:
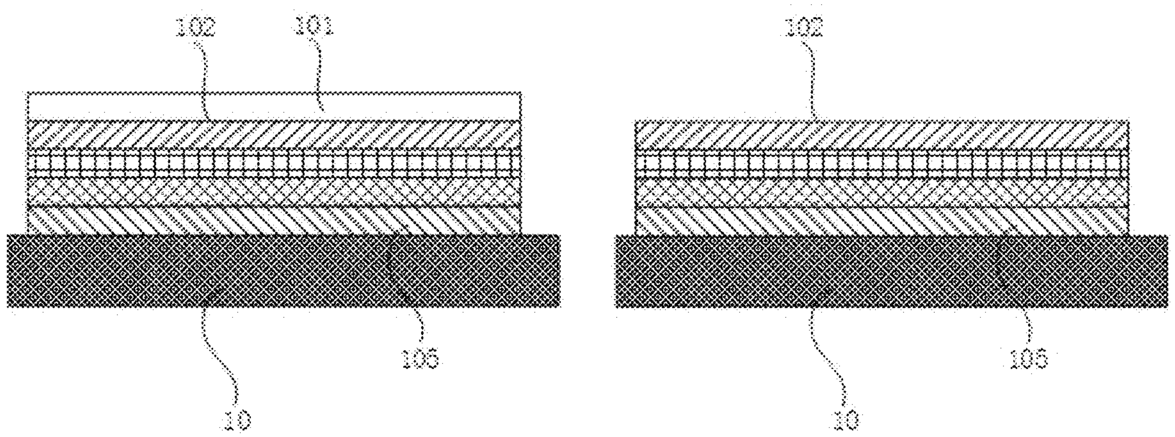
FIG. 10 is a schematic diagram of a structure corresponding to step S12 in a method of preparing a display panel according to Embodiment 2 of the present disclosure.
Figure 11:
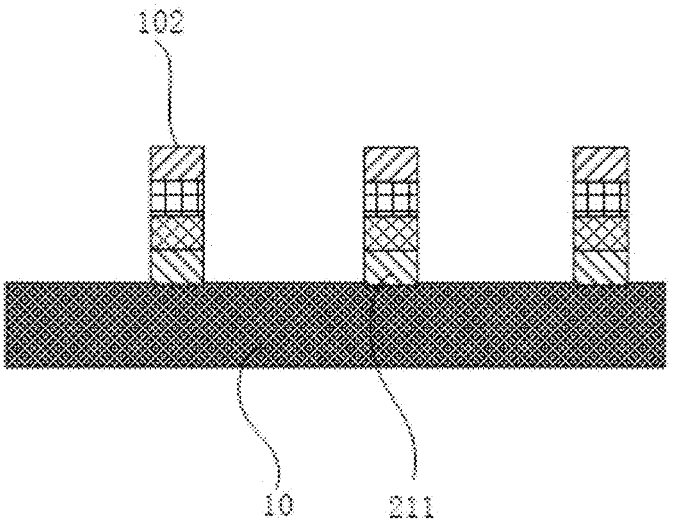
FIG. 11 is a schematic diagram of a structure corresponding to step S13 in a method of preparing a display panel according to Embodiment 2 of the present disclosure.
Figure 12:
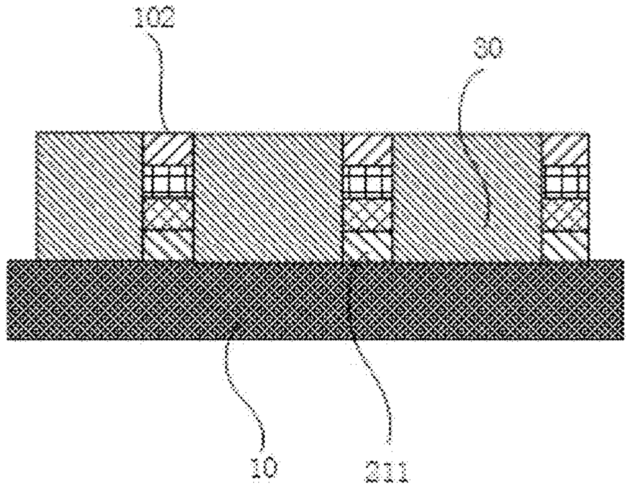
FIG. 12 is a schematic diagram of a structure corresponding to step S14 in a method of preparing a display panel according to Embodiment 2 of the present disclosure.
Figure 13:
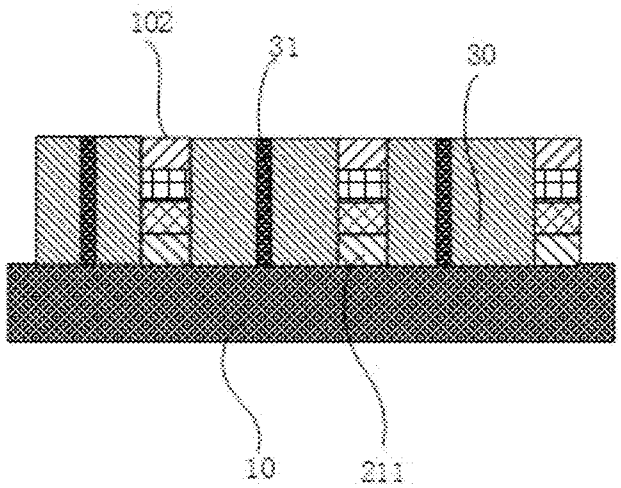
FIG. 13 is a schematic diagram of a structure corresponding to step S15 in a method of preparing a display panel according to Embodiment 2 of the present disclosure.
Figure 14:
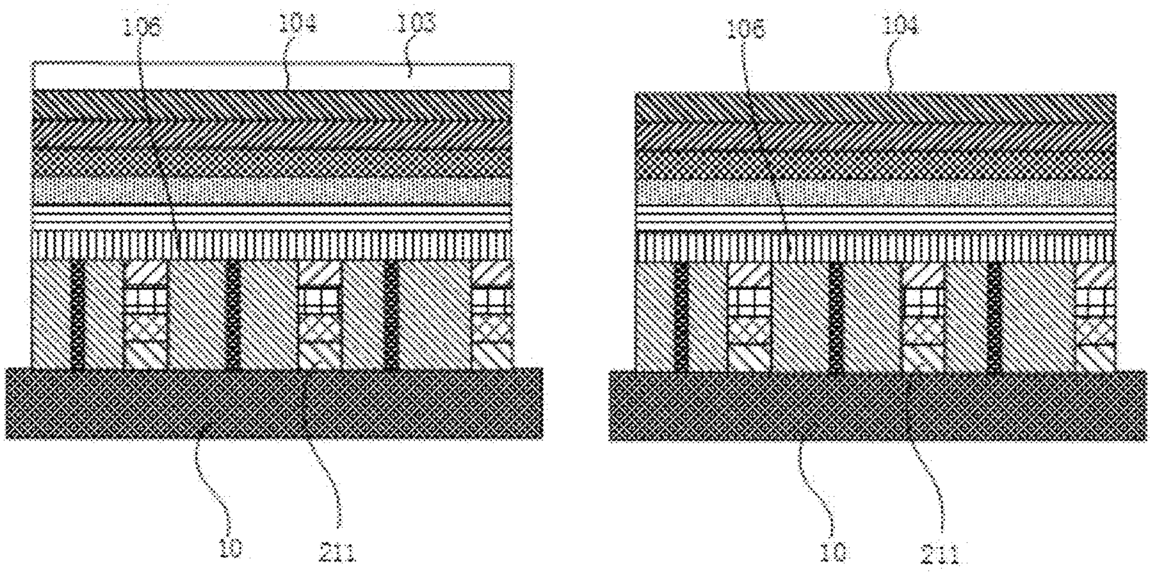
FIG. 14 is a schematic diagram of a structure corresponding to step S16 in a method of preparing a display panel according to Embodiment 2 of the present disclosure.
Figure 15:
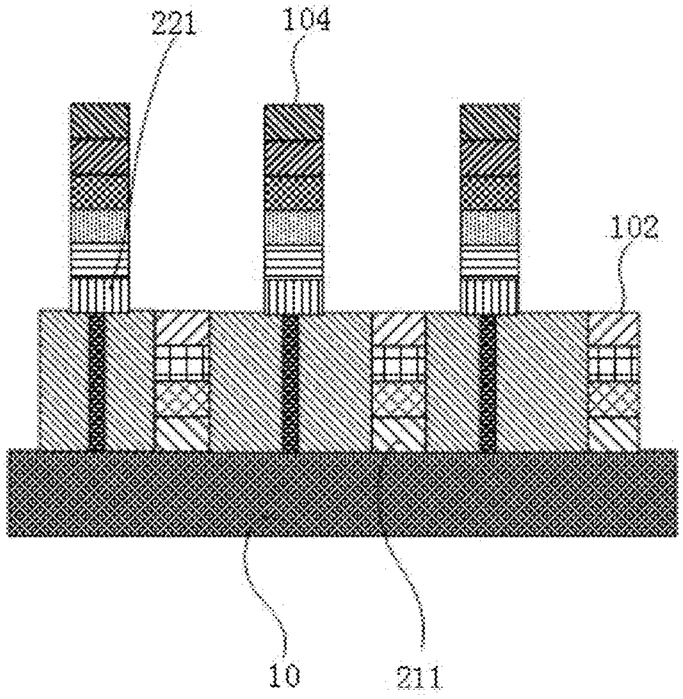
FIG. 15 is a schematic diagram of a structure corresponding to step S17 in a method of preparing a display panel according to Embodiment 2 of the present disclosure.
Figure 16:
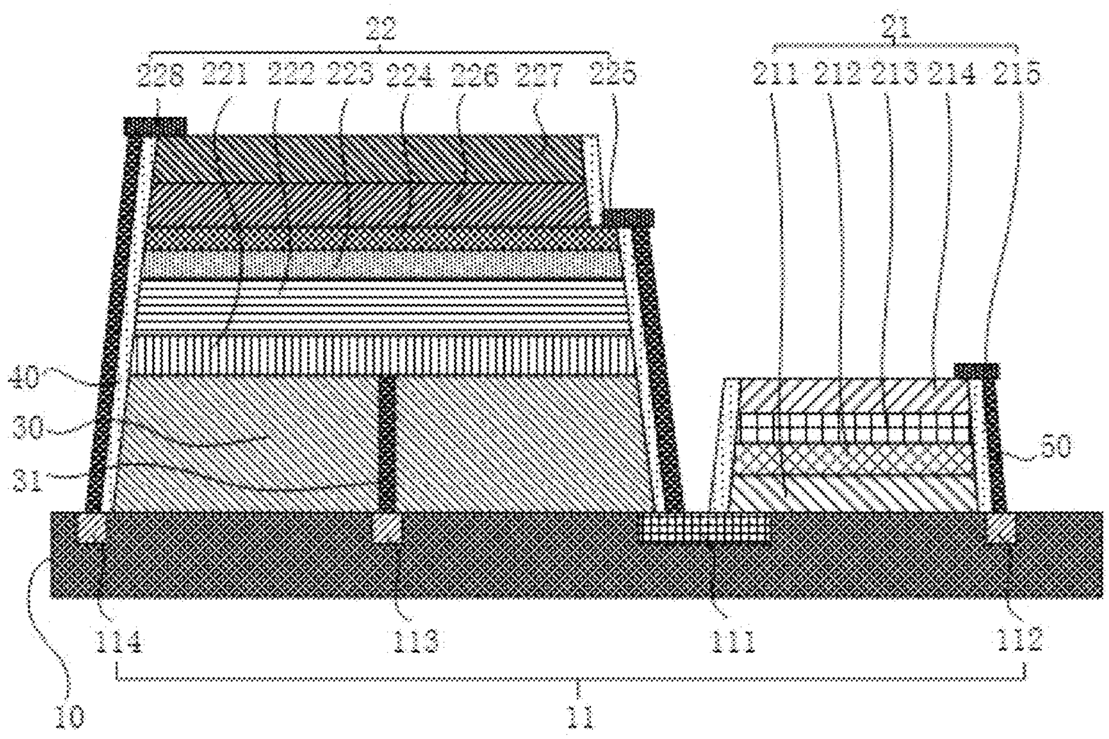
FIG. 16 is a schematic diagram of a structure corresponding to step S18 in a method of preparing a display panel according to Embodiment 2 of the present disclosure.

Specifically, FIG. 9 is a schematic diagram of a structure corresponding to step S11 in a method of preparing a display panel according to Embodiment 2 of the present disclosure. FIG. 10 is a schematic diagram of a structure corresponding to step S12 in a method of preparing a display panel according to Embodiment 2 of the present disclosure. FIG. 11 is a schematic diagram of a structure corresponding to step S13 in a method of preparing a display panel according to Embodiment 2 of the present disclosure. FIG. 12 is a schematic diagram of a structure corresponding to step S14 in a method of preparing a display panel according to Embodiment 2 of the present disclosure. FIG. 13 is a schematic diagram of a structure corresponding to step S15 in a method of preparing a display panel according to Embodiment 2 of the present disclosure. FIG. 14 is a schematic diagram of a structure corresponding to step S16 in a method of preparing a display panel according to Embodiment 2 of the present disclosure. FIG. 15 is a schematic diagram of a structure corresponding to step S17 in a method of preparing a display panel according to Embodiment 2 of the present disclosure. FIG. 16 is a schematic diagram of a structure corresponding to step S18 in a method of preparing a display panel according to Embodiment 2 of the present disclosure. With reference to FIGS. 8 to 16, the method of preparing a display panel includes steps of:

S11: Forming a first pixel composite layer 102 on a side of a first base 101, wherein the first pixel composite layer 102 includes a second semiconductor layer 214 of a second doping type, a first light-emitting unit layer 213, and a first semiconductor layer 212 of a first doping type sequentially stacked; forming a second pixel composite layer 104 on a side of a second base 103, wherein the second pixel composite layer 104 includes a fifth semiconductor layer 227 of the second doping type, a third light-emitting unit layer 226, a fourth semiconductor layer 224 of the first doping type, a second light-emitting unit layer 223, and a third semiconductor layer 222 of the second doping type sequentially stacked. The first base 101 is a GaAs base. The second doping type is N-type, and the second semiconductor layer 214 includes a GaAs material. The first doping type is P-type, and the first semiconductor layer includes a GaP material. The second base 103 is a sapphire base, or includes at least one of GaN, AlN, Si, or SiC. The fifth semiconductor layer 227 and the third semiconductor layer 222 include at least one of a GaN material, an AlGaN material, or an AlInGaN material. The fourth semiconductor layer 224 includes a GaN material.

S12: Bonding a side of the first pixel composite layer 102 facing away from the first base 101 to a side of an array substrate 10, and removing the first base 101. Step S12 specifically includes: forming a first metal bonding layer on the side of the first pixel composite layer 102 facing away from the first base 101, wherein a material of the first metal bonding layer may be any of Au, Sn, In, Ti, or Cu; forming a second metal bonding layer on the side of the array substrate 10, wherein a material of the second metal bonding layer may be any of Au, Sn, In, Ti, or Cu; bonding the side of the first pixel composite layer 102 facing away from the first base 101 to the side of the array substrate 10 by bonding the first metal bonding layer with the second metal bonding layer, wherein a first composite metal layer 105 is formed after the first metal bonding layer and the second metal bonding layer are bonded, and the first composite metal layer 105 is subsequently used to form a first electrode 211 of a first pixel unit 21, wherein the array substrate 10 includes a plurality of pad groups 11, each pad group 11 includes a first pad 111, a second pad 112, a third pad 113, and a fourth pad 114, the first electrode 211 is in contact with and electrically connected to the first pad 111, a thickness of the first electrode 211 is 0.1 microns to 3 microns, and the first electrode 211 further has a reflective function; removing the first base 101.

S13: Patterning the first pixel composite layer 102 and the first composite metal layer 105. The patterned first composite metal layer 105 forms a plurality of first electrodes 211.

S14: Forming an insulating protrusion 30 in a patterned area of the first pixel composite layer 102. Optionally, a distance between a surface of the insulating protrusion 30 facing away from the array substrate 10 and the array substrate 10 is a third distance. A distance between a surface of the first pixel composite layer 102 facing away from the array substrate 10 and the array substrate 10 is a fourth distance. The third distance is equal to the fourth distance. Specifically, the distance between the surface of the insulating protrusion 30 facing away from the array substrate 10 and the array substrate 10 can be equal to the distance between the surface of the first pixel composite layer 102 facing away from the array substrate 10 and the array substrate 10 through a chemical mechanical polish (CMP) process. Furthermore, the step of forming an insulating protrusion 30 in a patterned area of the first pixel composite layer 102 specifically includes: forming an insulating protrusion layer on the patterned area of the first pixel composite layer 102 and on a side of the first composite metal layer 105 facing away from the array substrate 10, and in this case, the insulating protrusion layer covers the first pixel composite layer 102; and then, performing the CMP process on the insulating protrusion layer to remove the insulating protrusion layer on the side of the first pixel composite layer 102 facing away from the array substrate 10, so that the distance between the surface of the insulating protrusion 30 facing away from the array substrate 10 and the array substrate 10 is equal to the distance between the surface of the first pixel composite layer 102 facing away from the array substrate 10 and the array substrate 10.

S15: Etching the insulating protrusion 30 to form a via hole 31, and depositing a conducting material in the via hole 31. The conducting material is electrically connected to the third pad 113.

S16: Bonding a side of the second pixel composite layer 104 facing away from the second base 103 to a side of the array substrate 10, and removing the second base 103. Step S16 specifically includes: forming a third metal bonding layer on the side of the second pixel composite layer 104 facing away from the second base 103, wherein a material of the third metal bonding layer may be any of Au, Sn, In, Ti, or Cu; forming a fourth metal bonding layer on the side of the array substrate 10, wherein a material of the fourth metal bonding layer may be any of Au, Sn, In, Ti, or Cu; bonding the side of the second pixel composite layer 104 facing away from the second base 103 to the side of the array substrate 10 by bonding the third bonding layer with the fourth bonding layer, wherein the third metal bonding layer and the fourth metal bonding layer are bonded to form a second composite metal layer 106, the second composite metal layer 106 is used to subsequently form a third electrode 221 of a second pixel unit 22, the third electrode 221 is in contact with and electrically connected to the third pad 113, a thickness of the third electrode 221 is 0.1 microns to 3 microns, and the third electrode 221 further has a reflective function; removing the second base 103.

S17: Patterning the second pixel composite layer 104 and the second composite metal layer 106. The patterned second composite metal layer 106 forms a plurality of third electrodes 221.

S18: Forming a second electrode 215 on a side of the second semiconductor layer 214 of the second doping type facing away from the array substrate 10; forming a fourth electrode 225 on a side of the fourth semiconductor layer 224 of the first doping type facing away from the array substrate 10; and forming a fifth electrode 228 on a side of the fifth semiconductor layer 227 of the second doping type facing away from the array substrate 10. The second electrode 215 is electrically connected to the second pad 112 through a connection line 50. An insulating layer 40 is formed between the connection line 50 and the first pixel unit 21. The fourth electrode 225 is electrically connected to the third pad 113 through the connection line 50. The fifth electrode 228 is electrically connected to the fourth pad 114 through the connection line 50. The insulating layer 40 is formed between the connection line 50 and the second pixel unit 22.

In the method of preparing a display panel provided in the present disclosure, because the first pixel composite layer 102 is patterned after the step of bonding a side of the first pixel composite layer 102 facing away from the first base 101 to a side of an array substrate 10, and removing the first base 101; and the second pixel composite layer 104 is patterned after the step of bonding a side of the second pixel composite layer 104 facing away from the second base 103 to a side of the array substrate 10, and removing the second base 103, a requirement for alignment accuracy of bonding can be significantly reduced. This is conducive to reducing production costs of the display panel.

In view of the above, the present disclosure provides a display panel and a preparation method thereof. The display panel includes an array substrate and a plurality of pixel unit groups. Each pixel unit group includes a first pixel unit and a second pixel unit, an orthographic projection of the first pixel unit on the array substrate and an orthographic projection of the second pixel unit on the array substrate are staggered. The first pixel unit includes a first light-emitting unit layer for emitting a first light color. The second pixel unit includes a second light-emitting unit layer for emitting a second light color and a third light-emitting unit layer for emitting a third light color. The second light-emitting unit layer and the third light-emitting unit layer are sequentially stacked in a direction facing away from the array substrate. In the display panel provided by the present disclosure, because each pixel unit group includes a first pixel unit and a second pixel unit, and the second pixel unit includes two light-emitting unit layers for emitting different light colors stacked, so that resolution can be improved, costs can be reduced, and display quality can be improved while achieving full-color display.

The above describes the display panel and the preparation method thereof provided in the embodiments of the present disclosure in detail. In this specification, although the principles and implementations of the present disclosure are described using specific examples, the descriptions of the foregoing embodiments are merely intended to help understand the method and the core idea of the present disclosure. In addition, a person skilled in the art may make modifications to the specific implementations and application range according to the idea of the present disclosure. In conclusion, the content of this specification should not be constructed as a limitation on the present disclosure.

What is claimed is:

1. A display panel comprising:

an array substrate; and a plurality of pixel unit groups disposed on a side of the array substrate, wherein each of the pixel unit groups comprises a first pixel unit and a second pixel unit, and an orthographic projection of the first pixel unit on the array substrate and an orthographic projection of the second pixel unit on the array substrate are staggered, the first pixel unit comprises a first light-emitting unit layer for emitting a first light color, and the second pixel unit comprises a second light-emitting unit layer for emitting a second light color and a third light-emitting unit layer for emitting a third light color, and the second light-emitting unit layer and the third light-emitting unit layer are sequentially stacked in a direction facing away from the array substrate;

wherein the first pixel unit comprises a first semiconductor layer of a first doping type, the first light-emitting unit layer, and a second semiconductor layer of a second doping type sequentially stacked in the direction facing away from the array substrate;

the second pixel unit comprises a third semiconductor layer of the second doping type, the second light-emitting unit layer, a fourth semiconductor layer of the first doping type, the third light-emitting unit layer, and a fifth semiconductor layer of the second doping type sequentially stacked in the direction facing away from the array substrate, and the first doping type is one of N-type or P-type, and the second doping type is another of N-type or P-type:

wherein the first semiconductor layer, the second semiconductor layer, the third semiconductor layer, the fourth semiconductor layer and the fifth semiconductor layer are separated from each other.

2. The display panel as claimed in claim 1, wherein the first light color is red, the second light color is blue, and the third light color is green.

3. The display panel as claimed in claim 1, wherein the first pixel unit further comprises:

a first electrode in contact with the first semiconductor layer of the first doping type, and a second electrode in contact with the second semiconductor layer of the second doping type; and the second pixel unit further comprises:

a third electrode in contact with the third semiconductor layer of the second doping type, a fourth electrode in contact with the fourth semiconductor layer of the first doping type, and a fifth electrode in contact with the fifth semiconductor layer of the second doping type, the first electrode and the fourth electrode are of a same electrode type, and are one of anodes and cathodes, and the first electrode is electrically connected to the fourth electrode, and the second electrode, the third electrode, and the fifth electrode are of a same electrode type, and are another of anodes or cathodes, and the second electrode, the third electrode, and the fifth electrode are insulated from each other.

4. The display panel as claimed in claim 3, wherein the fourth semiconductor layer of the first doping type comprises a first part that is not covered by the third light-emitting unit layer, and the fourth electrode is in contact with the first part.

5. The display panel as claimed in claim 3, wherein the array substrate comprises a plurality of pad groups, and each of the pad groups corresponds to one pixel unit group, each of the pad groups comprises a first pad, a second pad, a third pad, and a fourth pad, and the first pad is electrically connected to the first electrode and the fourth electrode, the second pad is electrically connected to the second electrode, the third pad is electrically connected to the third electrode, and the fourth pad is electrically connected to the fifth electrode.

6. The display panel as claimed in claim 5, wherein the first electrode is disposed on a side of the first semiconductor layer of the first doping type facing the array substrate, and the first electrode is in contact with and electrically connected to the first pad; and the third electrode is disposed on a side of the third semiconductor layer of the second doping type facing the array substrate, and the third electrode is in contact with and electrically connected to the third pad.

7. The display panel as claimed in claim 6, wherein a distance between a surface of the second semiconductor layer of the second doping type facing away from the array substrate and the array substrate is a first distance;

a distance between a surface of the fifth semiconductor layer of the second doping type facing away from the array substrate and the array substrate is a second distance, and the second distance is greater than the first distance.

8. The display panel as claimed in claim 1, wherein the first light color is red, the second light color is green, the third light color is blue.

9. The display panel as claimed in claim 8, wherein the first pixel unit further comprises:

a first electrode in contact with the first semiconductor layer of the first doping type; and a second electrode in contact with the second semiconductor layer of the second doping type; and the second pixel unit further comprises:

a third electrode in contact with the third semiconductor layer of the second doping type;

a fourth electrode in contact with the fourth semiconductor layer of the first doping type; and a fifth electrode in contact with the fifth semiconductor layer of the second doping type, the first electrode and the fourth electrode are of a same electrode type, and are one of anodes or cathodes, and the first electrode is electrically connected to the fourth electrode, and the second electrode, the third electrode, and the fifth electrode are of a same electrode type, and are another of anodes or cathodes, and the second electrode, the third electrode, and the fifth electrode are insulated from each other.

10. The display panel as claimed in claim 9, wherein the fourth semiconductor layer of the first doping type comprises a first part that is not covered by the third light-emitting unit layer, and the fourth electrode is in contact with the first part.

11. The display panel as claimed in claim 9, wherein the array substrate comprises a plurality of pad groups, and each of the pad groups corresponds to one pixel unit group, each of the pad groups comprises a first pad, a second pad, a third pad, and a fourth pad, and the first pad is electrically connected to the first electrode and the fourth electrode, the second pad is electrically connected to the second electrode, the third pad is electrically connected to the third electrode, and the fourth pad is electrically connected to the fifth electrode.

12. The display panel as claimed in claim 11, wherein the first electrode is disposed on a side of the first semiconductor layer of the first doping type facing the array substrate, and the first electrode is in contact with and electrically connected to the first pad; and the third electrode is disposed on a side of the third semiconductor layer of the second doping type facing the array substrate, and the third electrode is in contact with and electrically connected to the third pad.

13. The display panel as claimed in claim 12, wherein a distance between a surface of the second semiconductor layer of the second doping type facing away from the array substrate and the array substrate is a first distance, a distance between a surface of the fifth semiconductor layer of the second doping type facing away from the array substrate and the array substrate is a second distance, and the second distance is greater than the first distance.

14. The display panel as claimed in claim 11, wherein the first electrode is disposed on a side of the first semiconductor layer of the first doping type facing the array substrate, and the first electrode is in contact with and electrically connected to the first pad; and the third electrode is disposed on a side of the third semiconductor layer of the second doping type facing the array substrate, the display panel further comprises a plurality of insulating protrusions, each of the insulating protrusions is disposed between the third electrode and the array substrate, and the third electrode is electrically connected to the third pad through a via hole in each of the insulating protrusions.

15. The display panel as claimed in claim 14, wherein a distance between surfaces of the insulating protrusions facing away from the array substrate and the array substrate is a third distance;

a distance between a surface of the second semiconductor layer of the second doping type facing away from the array substrate and the array substrate is a fourth distance, and the third distance is equal to the fourth distance.

16. A display panel comprising:

an array substrate; and a plurality of pixel unit groups disposed on a side of the array substrate, wherein each of the pixel unit groups comprises a first pixel unit and a second pixel unit, and an orthographic projection of the first pixel unit on the array substrate and an orthographic projection of the second pixel unit on the array substrate are staggered, the first pixel unit comprises a first light-emitting unit layer for emitting a first light color, and the second pixel unit comprises a second light-emitting unit layer for emitting a second light color and a third light-emitting unit layer for emitting a third light color, and the second light-emitting unit layer and the third light-emitting unit layer are sequentially stacked in a direction facing away from the array substrate;

wherein the first pixel unit comprises a first semiconductor layer of a first doping type, the first light-emitting unit layer, and a second semiconductor layer of a second doping type sequentially stacked in the direction facing away from the array substrate;

the second pixel unit comprises a third semiconductor layer of the second doping type, the second light-emitting unit layer, a fourth semiconductor layer of the first doping type, the third light-emitting unit layer, and a fifth semiconductor layer of the second doping type sequentially stacked in the direction facing away from the array substrate, and the first doping type is one of N-type or P-type, and the second doping type is another of N-type or P-type;

wherein the first pixel unit further comprises:

a first electrode in contact with the first semiconductor layer of the first doping type, and a second electrode in contact with the second semiconductor layer of the second doping type; and the second pixel unit further comprises:

a third electrode in contact with the third semiconductor layer of the second doping type, a fourth electrode in contact with the fourth semiconductor layer of the first doping type, and a fifth electrode in contact with the fifth semiconductor layer of the second doping type, the first electrode and the fourth electrode are of a same electrode type, and are one of anodes and cathodes, and the first electrode is electrically connected to the fourth electrode, and the second electrode, the third electrode, and the fifth electrode are of a same electrode type, and are another of anodes or cathodes, and the second electrode, the third electrode, and the fifth electrode are insulated from each other;

wherein the array substrate comprises a plurality of pad groups, and each of the pad groups corresponds to one pixel unit group, each of the pad groups comprises a first pad, a second pad, a third pad, and a fourth pad, and the first pad is electrically connected to the first electrode and the fourth electrode, the second pad is electrically connected to the second electrode, the third pad is electrically connected to the third electrode, and the fourth pad is electrically connected to the fifth electrode;

wherein the first electrode is disposed on a side of the first semiconductor layer of the first doping type facing the array substrate, and the first electrode is in contact with and electrically connected to the first pad; and the third electrode is disposed on a side of the third semiconductor layer of the second doping type facing the array substrate, the display panel further comprises a plurality of insulating protrusions, each of the insulating protrusions is disposed between the third electrode and the array substrate, and the third electrode is electrically connected to the third pad through a via hole in each of the insulating protrusions.

17. The display panel as claimed in claim 16, wherein a distance between surfaces of the insulating protrusions facing away from the array substrate and the array substrate is a third distance;

a distance between a surface of the second semiconductor layer of the second doping type facing away from the array substrate and the array substrate is a fourth distance, and the third distance is equal to the fourth distance.

18. A method of preparing a display panel, comprising steps of:

forming a first pixel composite layer on a side of a first base, wherein the first pixel composite layer comprises a second semiconductor layer of a second doping type, a first light-emitting unit layer, and a first semiconductor layer of a first doping type sequentially stacked;

forming a second pixel composite layer on a side of a second base, wherein the second pixel composite layer comprises a fifth semiconductor layer of the second doping type, a third light-emitting unit layer, a fourth semiconductor layer of the first doping type, a second light-emitting unit layer, and a third semiconductor layer of the second doping type sequentially stacked;

bonding a side of the first pixel composite layer facing away from the first base to a side of an array substrate, and removing the first base; and bonding a side of the second pixel composite layer facing away from the second base to a side of the array substrate, and removing the second base, wherein the first pixel composite layer is patterned after the step of bonding the side of the first pixel composite layer facing away from the first base to the side of the array substrate, and removing the first base; and the second pixel composite layer is patterned after the step of bonding the side of the second pixel composite layer facing away from the second base to the side of the array substrate, and removing the second base, wherein after the first pixel composite layer is patterned, an insulating protrusion is formed in a patterned area of the first pixel composite layer, a via hole running through the insulating protrusion is formed, a distance between a surface of the insulating protrusion facing away from the array substrate and the array substrate is a third distance, a distance between a surface of the first pixel composite layer facing away from the array substrate and the array substrate is a fourth distance, the third distance is equal to the fourth distance; and then, the side of the second pixel composite layer facing away from the second base is bonded to the side of the array substrate, and the second base is removed.

* * * * *